(12) United States Patent
Gallouch

(10) Patent No.: US 12,292,313 B2
(45) Date of Patent: May 6, 2025

(54) METHOD FOR PRODUCING AN OPTICAL POSITION ENCODER

(71) Applicant: iC-Haus GmbH, Bodenheim (DE)

(72) Inventor: Monir Gallouch, Hessen (DE)

(73) Assignee: IC-HAUS GMBH, Bodenheim (DE)

( * ) Notice: Subject to any disclaimer, the term of this patent is extended or adjusted under 35 U.S.C. 154(b) by 180 days.

(21) Appl. No.: 18/017,109

(22) PCT Filed: Jul. 2, 2021

(86) PCT No.: PCT/EP2021/068312
§ 371 (c)(1),
(2) Date: Jan. 20, 2023

(87) PCT Pub. No.: WO2022/017761
PCT Pub. Date: Jan. 27, 2022

(65) Prior Publication Data
US 2023/0296412 A1    Sep. 21, 2023

(30) Foreign Application Priority Data
Jul. 23, 2020  (DE) .......................... 102020119511.7

(51) Int. Cl.
*G01D 5/34* (2006.01)
*G01D 5/347* (2006.01)
(Continued)

(52) U.S. Cl.
CPC ....... *G01D 5/34715* (2013.01); *H10F 55/255* (2025.01); *H10F 71/00* (2025.01); *H10F 77/50* (2025.01)

(58) Field of Classification Search
CPC .. G01D 5/34715; G01D 5/34; H01L 31/0203; H01L 31/173; H01L 31/18; H01L 33/20;
(Continued)

(56) References Cited

U.S. PATENT DOCUMENTS 5,657,125 A * 8/1997 Kato .................. G01D 5/38
                                                                  250/237 G
6,201,239 B1 * 3/2001 Yamamoto .......... G01D 5/366
                                                                  356/634
(Continued)

FOREIGN PATENT DOCUMENTS

DE            10353679 A1     6/2005
DE        102009039891 A1     3/2011
(Continued)

OTHER PUBLICATIONS

International Search Report pertaining to PCT Application No. PCT/EP2021/068312, filed Jul. 2, 2021, 5 pages.
(Continued)

*Primary Examiner* — Abdullahi Nur
(74) *Attorney, Agent, or Firm* — Thompson Hine LLP

(57) ABSTRACT

A method for producing an optical position encoder including an optoelectronic component and a measuring scale which is illuminated by an LED light source of the optoelectronic component. The LED light source is molded not a mold housing such that a light outlet surface of the LED light source is outwardly exposed, and the light outlet surface has a coating and is uncoated in some regions in order to provide a light outlet window. The disclosure additionally relates to an optical position encoder including an optoelectronic component with a mold housing in which an LED light source is arranged such that a light outlet surface of the LED light source is outwardly exposed, the light outlet surface being coated and having an uncoated light outlet window, and including a measuring scale which is illuminated by the LED light source of the optoelectronic component.

14 Claims, 3 Drawing Sheets

(51) Int. Cl.
*H10F 55/255* (2025.01)
*H10F 71/00* (2025.01)
*H10F 77/50* (2025.01)

(58) Field of Classification Search
CPC ....... H01L 33/46; H01L 25/167; H01L 31/16; H10F 55/255; H10F 71/00; H10F 77/50; G08G 5/25; H05K 5/10; H10D 86/0227
See application file for complete search history.

(56) References Cited

U.S. PATENT DOCUMENTS

| | | | |
|---|---|---|---|
| 6,486,467 B1* | 11/2002 | Speckbacher | H01L 31/167 250/237 G |
| 2002/0005477 A1* | 1/2002 | Holzapfel | G01D 5/34715 250/231.14 |
| 2005/0023450 A1* | 2/2005 | Ito | G01D 5/34746 250/231.13 |
| 2005/0219546 A1* | 10/2005 | Otsuka | G01D 5/34715 356/499 |
| 2009/0218588 A1 | 9/2009 | Panaccione et al. | |
| 2012/0072169 A1* | 3/2012 | Gribble | G01D 5/2455 702/150 |
| 2013/0207128 A1 | 8/2013 | Lin | |
| 2013/0228810 A1 | 9/2013 | Wang | |
| 2013/0292706 A1 | 11/2013 | Costello | |

FOREIGN PATENT DOCUMENTS

| | | |
|---|---|---|
| DE | 102012107578 A1 | 2/2014 |
| DE | 102014112540 A1 | 3/2016 |
| DE | 102015103253 A1 | 9/2016 |
| JP | 2008277176 A | 11/2008 |
| JP | 2011179938 A | 9/2011 |
| JP | 2019004162 A | 1/2019 |

OTHER PUBLICATIONS

International Preliminary Report on Patentability issued Feb. 2, 2023 which pertains to PCT Application No. PCT/EP2021/068312, filed Jul. 2, 2021, 9 pages.

* cited by examiner

METHOD FOR PRODUCING AN OPTICAL POSITION ENCODER

This application is a national stage filing of International (PCT) Application No. PCT/EP2021/068312, corresponding to International Publication No. WO 2022/017761 filed on Jul. 2, 2021, which in turn claims priority to German Application No. 10 2020 119 511.7 filed on Jul. 23, 2020. The entire contents of both of those applications are hereby incorporated by reference.

The present disclosure relates to a method for producing an optical position encoder having an optoelectronic component and having a measuring scale illuminated by an LED light source of the optoelectronic component, in which an LED light source is embedded into a molded housing in such a way that a light exit surface of the LED light source is exposed to the outside. An optical position encoder having an optoelectronic component having a molded housing, in which an LED light source is arranged in such a way that a light exit surface of the LED light source is exposed to the outside, and having a measuring scale illuminated by the LED light source of the optoelectronic component forms a further subject matter of the disclosure.

BACKGROUND

Such optoelectronic components are typically used in optical position encoders to be able to detect movements of components. For this purpose, a measuring scale is arranged on the component, which is irradiated by the LED light source of the optoelectronic component. The measuring scale is designed here in such a way that light of the LED light source incident on the measuring scale is modulated according to a specific pattern. The measuring scale can thus consist of light and dark regions, for example, wherein a line pattern is advantageous in particular. The modulated light can then be detected by a sampling receiver in the form of at least one light sensor. In this way, sine and cosine signal forms may largely be generated, which can be evaluated and thus provide information about the position of the component.

Such a position encoder can be designed either as a linear position encoder, which detects linear movements of the component, or as a rotation encoder for detecting rotational movements of the component. Accordingly, the measuring scale can be formed from lines arranged in parallel to one another having a rectangular shape overall or as a circular disk having radially extending lines. In addition, the position encoder can be designed either as an incremental encoder or also as an absolute encoder. In an incremental encoder, referencing can additionally be carried out at the beginning of a measuring procedure to obtain an item of local absolute information. This is not necessary in the case of an encoder which is absolute over the entire sampling range.

The measuring scale can also be designed differently depending on the application. Thus, on the one hand, transmitted light arrangements are known in which the measuring scale is arranged between the LED light source and the light sensor receiving the modulated light. The light areas are then usually formed by slotted light-transmissive regions of the measuring scale. Alternatively, the measuring scale can also be designed as a reflective arrangement, wherein then the light of the LED light source is reflected at the light panels and reaches the sensor.

To protect the sensitive microelectronic component parts of the component from negative effects, arranging these component parts in a molded housing is known, which encloses the component as a whole.

The term "molding" is understood in general here as a molding method and especially an injection molding method, in which liquid materials are injected into a mold, which is also referred to as an injection mold, under pressure. The material enters the solid state again in the mold due to cooling or a cross-linking reaction and is removed as a finished part after opening the mold. Housings produced in the injection molding method offer advantages in particular with regard to the processing speed and shaping in comparison to housings which are produced solely by so-called "casting," in which a liquid material is poured into a mold and solidifies therein. However, the individual components are subjected to significantly higher pressures in molding, because of which not every component is suitable for this production method.

An arrangement in which the individual component parts are arranged in a molded housing is known, for example, from DE 10 2012 107 578 A1. The LED light source is located there on a carrier and is enclosed on all sides by the molded housing. To enable a defined emission of the light of the LED light source upward and to prevent damage to the LED light source during the production process, a structured glass plate is located above the LED light source.

Such components have certainly proven themselves in use solely as an LED light, however, it has proven to be disadvantageous in the case of such arrangements that impairments of the light emission due to the glass plate arranged above the LED light source can occur for use in position encoders. This is because, on the one hand, undesired refractions of the light beams can occur at the transitions between LED light source and glass plate and between glass plate and the surroundings. On the other hand, reflections can occur, so that, for example, external light is also deflected in the direction of the measuring scale and thus results in a corruption of the measurement results.

To avoid impairments of the light emission due to a glass plate arranged above the LED light source, for example, making a light exit surface of the LED light source, via which the light exits from the LED light source, exposed to the outside is known from DE 10 2015 103 253 A1. Due to the exposure of the light exit surface to the outside, it is no longer located inside the mold housing, due to which in addition to a simplification of the structure, an emission of the LED light source in all directions can be achieved. Possible refractions, shadows, couplings due to scattered light, or other impairments can be prevented by avoiding elements arranged on or above the LED light source.

The emission properties of the LED light source are influenced by the precise dimensions of the light exit surface of the LED light source, which are in turn essentially defined by the production method and the manufacturing tolerances in the production of the LED light source. In this case not only differences between LED light sources of different producers, but also differences between LED light sources of different batches of the same producer and even between individual LED light sources of the same batch occur. The differences of the light exit surface influence the signal quality in a position encoder and limit the resolution of the optoelectronic component, wherein in particular large light exit surfaces result in a low resolution.

SUMMARY

Against this background, the disclosure specifies a method for producing an optoelectronic position encoder and an optoelectronic position encoder which improve the emission properties of the LED light source to achieve higher resolutions.

This concept can be achieved in a method of the type mentioned at the outset in that the light exit surface is coated and is de-coated in some regions to provide a light exit window.

In that the LED light source, which is in particular a semiconductor LED chip, is itself coated, it can furthermore be exposed to the outside. The coating thus forms an outer surface of the coated LED light source. Undesired refractions of the light beams at the transitions between the LED light source and a cover element, such as a glass plate, and between the cover element and the surroundings can be avoided. The resolution of the optoelectronic component is no longer defined by the production method and the manufacturing tolerances in the production of the uncoated LED light sources and in particular a semiconductor crystal of the semiconductor LED chip, but rather by the coating and the de-coating and the dimensions of the light exit window. The tolerances in the coating and the de-coating can be lower than the manufacturing tolerances. Better emission properties and in particular a better signal quality and higher resolutions can be achieved.

The LED light source can be equipped with an integrated masking by the coated light exit surface and the de-coated light exit window. A light exit window can be precisely manufactured by the de-coating and in particular can have sharp edges and thus improved emission properties.

The method can be carried out using LED light sources of different producers and/or batches. Due to the coating and de-coating, in spite of different production methods and the manufacturing tolerances of the LED light sources used, optoelectronic components having uniform emission properties can be produced. A light exit window having dimensions can be achieved which are essentially independent of the LED light source used and are below the dimensions of the light exit surface. In the case of a series production of multiple optoelectronic components, in spite of the differences between the individual LED light sources, a uniform light exit window can be achieved in all optoelectronic components.

According to one embodiment, the light exit surface can be coated over part of the surface. In particular, a part of the light exit surface which is to be used to provide the light exit window can remain uncoated from the outset. To provide the light exit window, the coated parts of the light exit surface can be de-coated in regions. In particular the edges of the light exit window, around the uncoated parts of the light exit surface, can be de-coated to achieve sharp edges of the light exit window. Carrying out the method in a manner which saves material and time can be enabled by the coating over part of the surface, in particular in the case of larger light exit windows.

The molded housing can be formed by a molding compound used to embed the LED light source. The molding compound can be injected for this purpose into an injection mold, in which the LED light source has already been arranged. The manufacturing of the molded housing and the embedding of the LED light source can take place in a time-saving manner in one method step.

In an advantageous manner, the light exit surface is coated over the entire surface or part of the surface using a coating, which is in particular essentially light-opaque and/or reflective. If the light exit surface is coated over the entire surface, the light exit window can be positioned freely on the light exit surface by a corresponding de-coating, without the position of an uncoated part of the light exit surface having to be taken into consideration. A light exit from the coated parts of the light exit surface can be prevented by an essentially light-opaque coating. An escape of light from the LED light source can be restricted in location by a light-opaque coating on the light exit window. The emission properties of the LED light source can be defined essentially independently of the dimensions of the entire light exit surface via the dimensions of the light exit window. A reflective coating, in particular a coating mirrored in the direction of the interior of the LED light source, enables a light reflection into the interior of the LED light source if individual light beams are incident on the coating and not on the de-coated light exit window. The light yield of the LED light source can be increased by the reflection in the interior of the LED light source. In particular in the case of a multiple reflection, a light beam reflected in the interior of the light source can be reflected again in such a way that it can exit from the LED light source via the light exit window. Bundling of the light generated by the LED light source on the light exit window can be achieved in this way.

The light exit surface can be coated over the entire surface or part of its surface using multiple coatings, so that in particular a multilayer coating of the light exit surface results. The effects of the individual coatings, in particular to improve the emission properties of the LED light source, can be combined with one another in a simple manner by multiple coatings and in particular a multilayer coating.

The coating and/or the coatings can consist in particular of nonorganic compounds.

It is particularly advantageous in this context if the light exit surface is coated using a metallic coating, in particular using a coating made of gold or a gold alloy. Metallic coatings, in particular coatings made of gold or a gold alloy can be applied to the light exit surface using a simple method. Thin coatings, which thus have little bulk, of the light exit surface may be achieved in a material saving manner using metallic coatings. A light-opaque and/or reflective coating may be achieved in a simple manner using metallic coatings and in particular coatings made of gold or gold alloys, in particular at layer thicknesses of a few hundred nanometers. A chromium-gold alloy may be particularly advantageous for coating the light exit surface. The light yield of the LED light source can be increased by multiple reflections in a particularly simple manner using a chromium-gold coating.

In a further embodiment, at least one peripheral partial surface of the LED light source is coated. The same or a different coating used for coating the light exit surface can be used to coat the peripheral partial surface. In particular, the peripheral partial surface can be coated using multiple coatings and/or in multiple layers. A light path out of the LED light source which does not extend through the light exit window can be suppressed by the coating of the peripheral partial surface, which extends essentially transversely to the light exit surface, depending on the shape of the LED light source. In this way, it is possible to prevent undesired scattered light from being incident on an adjacent light sensor and resulting in corruption of the output signal. The coated peripheral partial surface can alternatively or additionally be used for reflecting a light beam in the direction of the interior of the LED light source, in order to increase the light yield of the LED light source by multiple reflections.

It is furthermore advantageous if four peripheral partial surfaces, in particular all peripheral partial surfaces of the LED light source are coated. The coating of the individual peripheral partial surfaces can be embodied differently from one another or identically to one another. In particular, the peripheral partial surfaces can be coated at the same time.

Furthermore, it can be advantageous if the at least one peripheral partial surface of the LED light source and the light exit surface are coated in succession. The peripheral partial surface can be coated first and the light exit surface can be coated subsequently thereto. Similarly, the light exit surface can also be coated first and the peripheral partial surface can be coated subsequently thereto. In the case of successive coating of the peripheral partial surface and the light exit surface, in particular different coatings can be applied to the at least one peripheral partial surface and the light exit surface.

It is furthermore advantageous if the light exit surface is coated using a different coating than the at least one peripheral partial surface of the LED light source. Since the peripheral partial surface is embedded in the molded housing and is in contact therewith, while the light exit surface is exposed to the outside, this differing arrangement of the individual surfaces in the optoelectronic component can be taken into consideration by the coatings different from one another of the at least one peripheral partial surface and the light exit surface. The coating of the light exit surface can be designed in such a way that it is as light-opaque as possible, so that except for the light exiting through the light exit window, no further light exits from the LED light source via the light exit surface exposed to the outside in the molded housing. The coating of the peripheral partial surface, in contrast, can primarily be designed to be reflective, so that the overall light yield of the LED light source can be increased. The light opacity of the peripheral partial surface can take a backseat in comparison thereto, since the peripheral partial surface presses against the molded housing, so that the molded material also contributes to reducing undesired scattered light, in addition to the coating of the peripheral partial surface.

According to a further embodiment, it is proposed that the light exit surface is coated by physical gas phase deposition, in particular by sputtering. The light exit surface can be coated in a simple manner using a coating, in particular a thin coating, by physical gas phase deposition. A coating having a substantially homogeneous and previously defined layer thickness and/or a structured coating can be achieved by the physical gas phase deposition, in particular by sputtering. A chemical reaction with the light exit surface can be avoided by the physical gas phase deposition. A change of the surface structure of the light exit surface, in particular in the region of the light exit window, after the de-coating in some regions can be avoided by the use of physical gas phase deposition for coating.

A further embodiment provides that the light exit surface is de-coated by etching, mechanical processing, and/or lasering. A de-coating in some regions of the light exit surface by etching, mechanical processing, and/or lasering can be used for de-coating the entire surface of the part of the light exit surface forming the light exit window. Alternatively, the de-coating methods can be used to enlarge an uncoated part of the light exit window, in particular to achieve sharp edges delimiting the light exit window in the transition to the coated regions of the light exit surface. The etching, the mechanical processing, and/or the lasering can be used for de-coating some regions of the coated light exit surface, in the case of an LED light source already embedded in the molded housing. In the de-coating by etching and/or lasering, photolithographic methods can be used, using which the dimensions and the geometry of the light exit window can be predetermined in a simple manner and the light exit surface can be de-coated in the area of the light exit window. De-coating of the light exit surface by lasers enables one or more small-area light exit windows to be provided, using which the resolution of the optoelectronic component can be increased. Light exit windows having a width in the range of 50 µm and less, in particular having a slot width of 20 µm and less, may be achieved by lasering. For de-coating by mechanical processing, the coated light exit surface can be processed by ablation, in particular by grinding or sawing.

The light exit surface can be de-coated in the form of a rectangle, gap, ellipse, and/or circle to provide the light exit window. The geometric shape of the light exit window can be individually adapted to the usage requirements of the optoelectronic component by the de-coating of the light exit surface in some regions in the form of a rectangle, gap, ellipse, and/or circle. The de-coating in the form of a rectangle, gap, ellipse, and/or circle can be combined with one another to achieve a light exit window of more complex geometry. Different shapes of the light exit window may be achieved in a simple manner by a combination.

In a further embodiment, the light exit surface is coated before or after the molding. A coating of the light exit surface before the molding enables a coating which covers the light exit surface with an overlap on peripheral partial surfaces. Such an overlap can be advantageous if coating of one or more peripheral partial surfaces also takes place, in particular using the same coating as was used to coat the light exit surface. The LED light source can be covered between the light exit surface and the peripheral partial surfaces in this manner, in particular in the known region. The steps for providing the light exit window can take place jointly after the molding by way of a coating of the light exit surface taking place after the molding.

A further embodiment provides that the light exit surface is de-coated in some regions before or after the molding. In the case of de-coating before the molding, the provision of the light exit window can already take place before the molding process. The light exit window can be provided on an LED light source fixed in position in the molded housing due to de-coating of the light exit surface after the molding. The location and orientation of the light exit window of the LED light source can be produced at a position predeterminable in relation to the molded housing or a light sensor arranged in the molded housing in the case of de-coating taking place after the molding. A reproducible production of optoelectronic components having identical emission properties is enabled by the de-coating after the molding. Effects on the position and/or location of the light exit window relative to the molded housing or to the light sensor due to differences between individual light sources and position variations of the LED light source in relation to the molded housing or the LED light source in relation to the light sensor, which possibly occur during molding, can be avoided by de-coating after the molding.

In one embodiment, the coating of the light exit surface and the de-coating in some regions of the light exit surface can both take place before the molding, the coating of the light exit surface can take place before the molding and the de-coating in some regions can take place after the molding, or the coating of the light exit surface and the de-coating in some regions of the light exit surface can both take place after the molding.

In an optical position encoder of the type mentioned at the outset, to achieve the above concept it is proposed that the light exit surface is coated and has a de-coated light exit window.

Since the LED light source, which is in particular a semiconductor LED chip, is itself coated, it can still be exposed to the outside. Undesired refractions of the light beams at the transitions between the LED light source and a cover element, such as a glass plate, and between the cover element and the surroundings are avoidable. The LED light source can be equipped with an integral masking by the coated light exit surface and the de-coated light exit window. Since the resolution of the optoelectronic component, due to the coating of the light exit surface and the de-coating of the light exit window, is no longer dependent on the production method and the manufacturing tolerances in the production of the different LED light sources, in particular a semiconductor crystal of the semiconductor LED chip, and is no longer dependent on the alignment of the LED light source to a light sensor, but rather on the coating and the de-coating and the dimensions of the light exit window, better emission properties and in particular better signal qualities and higher resolutions are achievable. The tolerances in the coating and the de-coating can be significantly lower than the manufacturing tolerances.

The de-coated light exit window can be able to be manufactured more precisely and in particular can have sharp edges and thus improved emission properties.

The features described in conjunction with the method can also be used individually or in combination in the optical position encoder. The same advantages which have already been described result.

According to one constructive embodiment, it is proposed that the light exit surface has an essentially light-opaque and/or reflective coating. The coating can extend here not only over the light exit surface, but can also additionally cover the entirety of the peripheral partial surfaces of the LED light source, in particular the LED light source. The coating can advantageously cover all sides of the LED light source with the exception of the contact side for electrically contacting the LED light source, in particular can cover the entire surfaces of these sides. The contact side of the LED light source can be diametrically opposite to the light exit surface, so that the LED light source can be designed like a so-called flip chip LED. A multiple reflection can be achievable in the interior of the LED light source by the coating, in particular the reflective coating, of the peripheral partial surfaces. The light yield of the LED light source, i.e., the intensity of the light exiting through the light exit window from the LED light source, can be increased. The coating can be multilayer and in particular multi-ply.

Furthermore, it can be advantageous if the coating has a layer thickness of less than 600 nm, in particular less than 400 nm. The optoelectronic component can be designed in a material-saving manner by a layer thickness of less than 600 nm and in particular less than 400 nm. Weight and costs may be saved in this way.

In one advantageous embodiment, a side of the LED light source facing away from the light exit surface is a contact side of the LED light source. The side of the LED light source facing away from the light exit surface can be the side of the LED light source diametrically opposite to the light exit surface. The optoelectronic component can be equipped with an LED light source like a flip chip by the contact side. Contact wires and electrically conductive channels for electronically contacting the light exit surface can be omitted due to the flip chip geometry. Shadows due to contact wires can be avoided. The entire light exit surface can be usable to provide a light exit window.

To avoid a risk of short-circuit, the contact side can advantageously be formed uncoated. The coating of the light exit surface and/or the coating of one of the peripheral partial surfaces can in particular not extend up to the contact side of the LED light source. The LED light source can advantageously exclusively be able to be electrically contacted via the contact side.

The molding compound of the molded housing can be nontransparent, in particular in the wavelength range of the LED light source. Undesired light effects, such as scattered light or the like, can be suppressed by a molded housing made of a nontransparent molding compound. The molding compound can in particular be opaque, i.e., not translucent, so that light cannot pass through the molded housing or cannot exit therefrom with the exception of the light exit surface of the LED light source. It is possible, but not required, to provide an additional separating element to suppress external light incidence on the molded housing and/or the LED light source. The molding compound can have a low coefficient of thermal expansion, so that no temperature restrictions are provided. Negative effects can be reduced by the nontransparent and in particular opaque molding compound, such as scattering or reflections due to scratching of the surface of the molded housing. In addition, the advantage results that standard materials can be used, by which a reduction of the production costs is achievable. The molding compound can in particular be an epoxy resin.

One embodiment provides that at least one light sensor is arranged in the molded housing. Light in particular reflected and modulated on a measuring scale can be detected via the light sensor. The light sensor can have photosensitive optoelectronic surfaces for this purpose and can provide the received signals in the form of electrical output signals. The light sensor can comprise multiple partial surfaces and/or further circuit elements. The partial surfaces of the light sensor can be arranged symmetrically to one another. Multiple partial surfaces can also be combined to form groups. The partial surfaces can be arranged mirror symmetrically in relation to one another, wherein the symmetries of the sensor surfaces are to be taken into consideration for a rotation arrangement in a rotation encoder. The individual sensor surfaces can be periodically electrically connected to one another.

In one refinement, the direct light path between the LED light source and the light sensor is prevented, in particular by the molded housing. In this way, undesired scattered light can be prevented from being incident on the sensor surfaces of the light sensor and resulting in a corruption of the output signal. The prevention of the light path can be achieved by a coating of the peripheral partial surface of the LED light source facing toward the light sensor and/or by the nontransparent, in particular opaque molded housing. The molding compound can be arranged between the individual elements for this purpose, for example between the LED light source and the light sensor. The use of an additional, in particular nontransparent and/or opaque optical partition element is possible, but is not required. In the case of a partition element, it can be arranged between the LED light source and the light sensor and can be designed, for example, as a web, wall, partition wall, or the like.

The molded housing can have a recess in the region of the light sensor, via which the modulated light can reach the light sensor. The recess can be formed by a transparent auxiliary element arranged above the light sensor, such as a plate made of glass, plastic, or a transparent resin. The auxiliary element can terminate flush with the outside of the molded housing, due to which a level profile of the outside of the housing results. The auxiliary element can be designed in such a way that the modulated light can only be incident on certain regions of the sensor. For this purpose, the auxiliary element can be designed as a masking attachment. The auxiliary element designed as a masking attachment can be manufactured, for example, from a light-opaque material and can have light-transmissive, in particular transparent recesses or can be manufactured from a light-transmissive, in particular transparent material, to which a light-opaque coating can be applied. Alternatively or additionally, the auxiliary element can be used as a protective element, in particular to be able to protect the light sensor from damage.

According to one constructive embodiment, it is proposed that an auxiliary element arranged for protection above the light sensor has the same height as the LED light source. The auxiliary element, which is arranged in particular above the light sensor, can also terminate flush with the upper side of the molded housing, so that a level outer surface results in the emission direction of the optoelectronic component. The auxiliary element can be arranged together with the LED light source on a carrier. Advantages result in this way in particular in the production of the optoelectronic component and in particular in the positioning of the LED light source and the auxiliary element in the injection mold before the molding.

In addition, an embodiment is advantageous in which multiple LED light sources and/or multiple light sensors are provided. By providing multiple LED light sources and/or light sensors, multiple code tracks can be implementable in an optoelectronic component, by means of which multiple items of position information can be obtained and evaluated, in particular in cooperation with multiple measuring scales.

According to a further constructive embodiment, the LED light source and/or the light sensor is arranged on a carrier. The carrier can be a chip formed from a semiconductor substrate. Alternatively, the carrier can be a lead frame, a base, or another element for defining position. In the case of a carrier designed as a chip, this can in turn be arranged on a lead frame, such as a metallic line carrier that can be soldered in the form of a frame or an insulating carrier. The LED light source and/or the light sensor can be arranged elevated, due to which the possibility results in a simple manner that the LED light source and/or the light sensor is exposed to the outside at least with a partial surface and/or terminates flush with the molded housing.

The LED light source can be arranged on a carrier comprising the light sensor and/or a signal processing unit. The carrier can be designed as a chip made of a semiconductor substrate. As the signal processing unit, the chip can evaluate the items of position information detected by the light sensor and provided as electrical output signals. Alternatively or additionally, the light sensor and/or the signal processing unit can be integrated in the chip. The LED light source can be arrangeable on the carrier designed as a chip as a chip-on-chip structure.

One advantageous embodiment provides a signal processing unit for the LED light source and/or the light sensor. By means of the signal processing unit, the signals detected by the light sensor can be processed, the LED light source can be activated, and/or further signal processing processes can be carried out. The signal processing unit can be an integrated circuit, in particular a carrier designed as a semiconductor chip. The LED light source and the light sensor can each be assigned a signal processing unit, which can in particular be connected to one another or to a control unit for data exchange.

The LED light source can be designed in such a way that it emits light having a wavelength of less than 700 nm, in particular less than 500 nm. Finer structures, in particular of a measuring scale, can be detectable due to the use of light of this wavelength range. The light emitted by the LED light source can be in the wavelength range of visible light or below. The LED light source can emit green, blue, or ultraviolet light. Due to the use of light having a wavelength of less than 500 nm, the light sensors can resolve smaller dimensions or angular areas, such as angular corners or angular notches. The wavelength of the emitted light can be less than 480 nm, furthermore the wavelength of the emitted light can be greater than 400 nm, in one case greater than 425 nm, and particularly in one case greater than 450 nm. In addition, the advantage results upon the use of a blue or even shorter-wave LED light source that harder semiconductor materials can be used than with other LED light sources, which are less susceptible to scratching and moreover can withstand higher pressures during the production process, in particular during the molding.

In a circular measuring scale having a code track of 26 mm diameter, a line width of 37 μm on the measuring scale can be resolvable, instead of the previously possible 60 μm, with the aid of the optoelectronic component at 1000 pulses.

In one advantageous embodiment, the measuring scale is made partially reflective and coded. Due to a reflective design of the measuring scale, the LED light source and a light sensor can be arranged in a common optoelectronic component. The light emitted by the LED light source through the light exit window can be reflected by the measuring scale in the direction of the light sensor and detected thereby. The measuring scale can be designed as an absolutely coded measuring scale, by which a unique position value is determinable for every resolvable position. Carrying out a referencing at the beginning of a measurement can be omitted, wherein this can nonetheless be carried out.

In one embodiment, multiple light sensors are provided for determining an absolute position. Due to the presence of multiple light sensors, multiple code tracks of the measuring scale can be sampled and more accurate position data can be detected. One or more LED light sources can be provided for multiple light sensors, light sensor groups, and/or multiple code tracks of the measuring scale. Each code track of the measuring scale can be assigned a group of partial surfaces. The LED light sources can be arranged between the light sensors, in particular in the middle between the light sensors or symmetrically in relation to a sensor axis. In this way, a more accurate position detection can be carried out. The optical position encoder can have at least two light sensors for absolute position detection.

BRIEF DESCRIPTION OF THE DRAWINGS

Further details and advantages are to be explained by way of example hereinafter on the basis of the exemplary embodiments illustrated in the figures. In the figures.

DETAILED DESCRIPTION

Figure 1A:
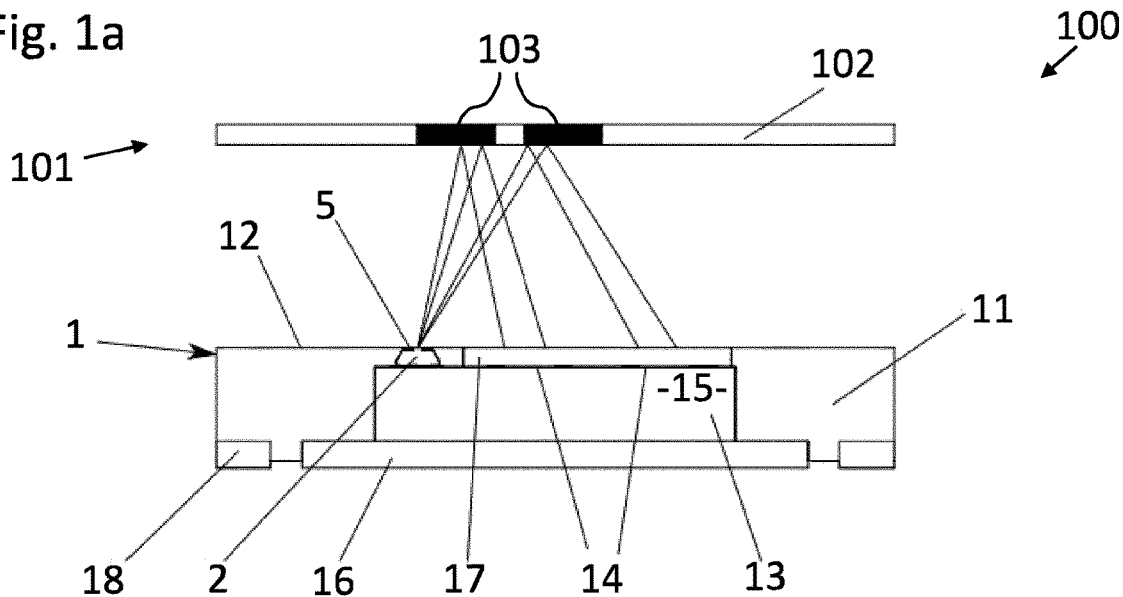
FIG. 1a shows a first exemplary embodiment of an optical position encoder in a schematic sectional illustration.

FIG. 1 and FIG. 2 show two exemplary embodiments of an optical position encoder 100. These types of optical position encoders 100 are often used in industry to be able to detect the position of components. The position encoders 100 can be designed for this purpose as linear position encoders or also as rotation encoders.

To be able to detect the position of a component, a measuring scale 101 is arranged on the component, which has different regions 102, 103. The regions 102, 103 can be largely absorbing (shown light) and largely reflective (shown dark) surfaces, which accordingly differently utilize light incident thereon of an LED light source 2. The regions 103 each form a code track, in which during a movement of the measuring scale 101 perpendicular to the plane of illustration, reflecting and absorbing fields alternate and thus modulate the light incident thereon. One or more code tracks 103 can be provided to generate incremental signals or index signals, so that a relative or also absolute position determination is enabled. In the first exemplary embodiment according to FIG. 1a and FIG. 2a, the measuring scale 101 is formed in two tracks and moves relatively and orthogonally to an axis of the optoelectronic component 1 connecting the LED light source 2 and a light sensor 14.

Figure 1B:
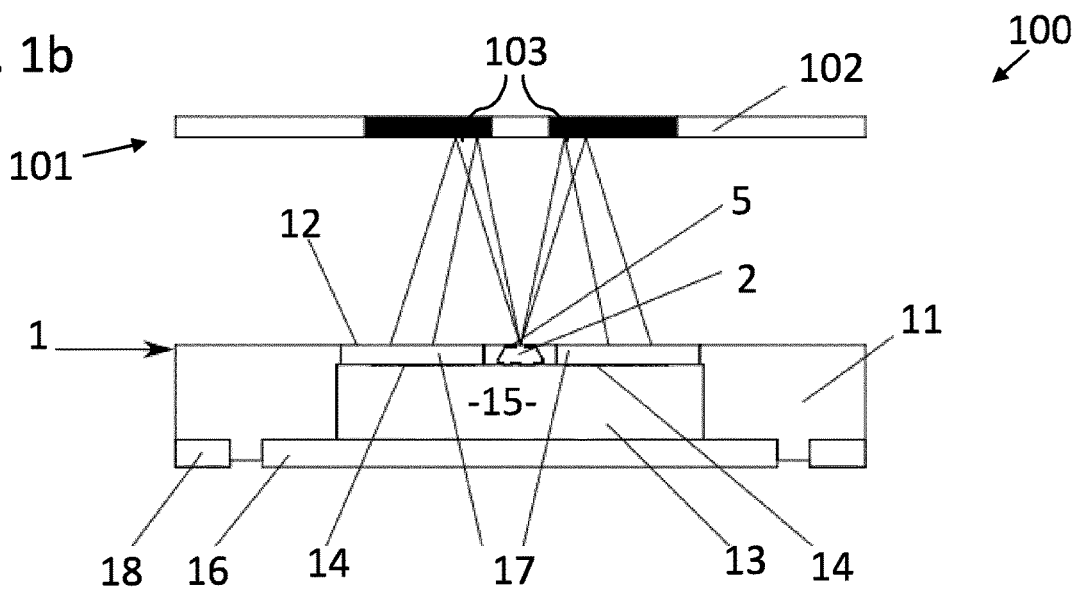
FIG. 1b shows a second exemplary embodiment of an optical position encoder in a schematic sectional illustration.
Figure 2A:
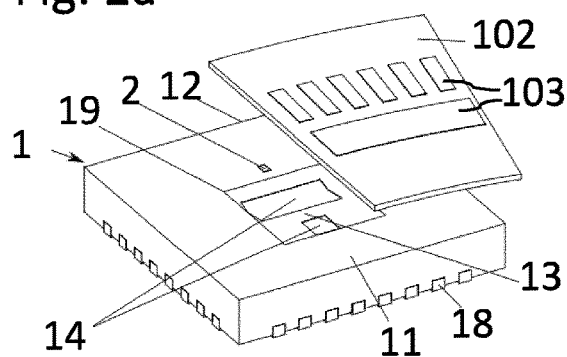
FIG. 2a shows the optical position encoder according to FIG. 1a in a schematic perspective.
Figure 2B:
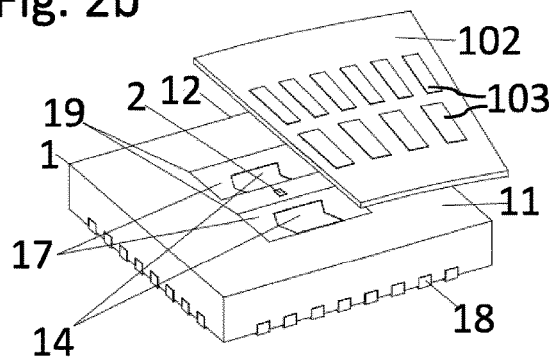
FIG. 2b shows the optical position encoder according to FIG. 1b in a schematic perspective.

In the second exemplary embodiment according to FIG. 1b and FIG. 2b, the measuring scale 101 also has two code tracks formed by the regions 103. The optical position encoder 101 of this exemplary embodiment is an absolute encoder, in which multiple code tracks on the measuring scale 101 are sampled, which form, for example, a pseudo-random code. Measuring scales 101 are designated as absolutely coded, the regions 103 of which have a digital binary coding which is unique for every resolvable position and which consists of multiple simultaneously detected code points. Absorbing fields of the measuring scale 101 can generate logical low signals and reflecting fields can accordingly generate logical high signals in this case.

In both exemplary embodiments, however, diffusely reflective or diffractive regions 102, 103 of the measuring scale 101 can also be used.

To be able to detect the position of the component using the measuring scale 101, the optical position encoder 100 has an optoelectronic component 1, which emits light in the direction of the measuring scale 101. The optoelectronic component 1 has an LED light source for this purpose, for example in the form of an LED chip.

Such an LED chip as LED light source 2 is a light-emitting diode consisting of a semiconductor crystal 3 having a base region 4. The pn junction of the LED light source is arranged here in such a way that the generated light essentially exits through a light exit surface 5 in the emission direction from the LED light source and is thus emitted by the optoelectronic component 1 in the direction of the measuring scale 101.

In the optoelectronic component 1, the LED light source 2 is arranged on a carrier 13, so that the light exit surface 5 is exposed to the outside. The light exit surface 5 terminates essentially flush with an outside 12 of a molded housing 11 here. In this way, a smooth surface of the optoelectronic component 1 results in the region of the LED light source 2. During the production process and the general handling during testing and equipping a printed circuit board with the optoelectronic component 1, this essentially smooth surface of the optoelectronic component 1 provides advantages. An injection mold used during the production can thus be designed more simply, in particular without formations, since no structures are required for defining the position or for visual adjustment. Moreover, guides and grippers designed for handling surface-mountable standard components and suction units for testing and equipping devices can be used.

The light exit surface 5 is formed level in the exemplary embodiments. Through a light exit window 10 of the light exit surface 5, which is delimited by a coating 9 of the light exit surface 5, the light can be emitted in a light beam which is smaller than the entire light exit surface 5. Since the coated light exit surface 5 of the LED light source 2 is exposed to the outside, influences on the light beams after their exit, for example by further parts of the optoelectronic component 1, are prevented. It can thus be ensured that the light beams are incident in a suitable manner on the measuring scale 101.

Because a sharply delimited light beam of small dimensions can be provided by the light exit window 10 in order to be detected by the light sensor 14 on the carrier 13 for position determination after the modulation by the measuring scale 101, a measuring scale 101 having code tracks 103 can be used in the position encoder 100, the absorbing and reflecting fields of which forming the coding have, at 37 μm, significantly smaller dimensions in the direction of the movement direction of the measuring scale 101 than conventional measuring scales. An accurate and higher-resolution position determination is enabled by the fields of the code tracks 103 having smaller dimensions, which can nonetheless still be resolved because of the LED light source 2 having a light exit window 10.

A possible intensity loss of the light beams can be readjusted via a signal processing unit 15. The signal processing unit 15 is part of the carrier 13 in the illustrated exemplary embodiments, which is designed as a semiconductor chip comprising the signal processing unit 15. In addition to the signal processing unit 15, the carrier 13 also comprises the two light sensors 14, which are arranged together with the LED light source 2 along a common axis, as shown in FIG. 2.

In the present exemplary embodiments, the carrier 13 is in turn arranged on a lead frame 16.

The LED light source 2 of the exemplary embodiments is designed as an LED having a wavelength of 500 nm. Due to the use of an LED light source which emits light in this wavelength range, the efficiency of the light sensors 14 of the optoelectronic component 1 may be increased in comparison to the use of light of greater wavelength. The light having shorter wavelength thus does not penetrate as deeply into the semiconductor substrate of the light sensors 14, so that sufficient charge carriers can be generated and separated in the spatial charge zone in order to increase the efficiency of the light yield. In addition, light having shorter wavelength results in sharper imaging of structures of the code tracks 103 and thus in higher resolution of the position encoder 100.

A further advantage of LED light sources 2, which emit the light at a wavelength of less than 700 nm and in particular less than 500 nm, is the mechanical properties of the materials used. In contrast to other LED light sources 2, these are made harder, so that they can better withstand the pressure occurring during the molding. A protected arrangement of the LED light source 2 in the interior of the molded housing 11 is therefore not required. Rather, the LED light source 2 can be in direct contact with an injection mold not shown during the molding. The LED light source can consist, for example, of carbide in combination with II-VI or III-V semiconductors.

The light emitted by the LED light source 2 is emitted in the direction of the measuring scale 101 and reflected thereon. Due to the alternating fields of the code tracks 103, the light is modulated in accordance with the coding of the measuring scale 101. The modulated light is reflected back in the direction of the light sensor 14, also arranged in the optoelectronic component 1, which detects the modulated light.

The light sensor 14 comprises an integrated circuit and is embodied as part of the carrier 13 designed as the semiconductor chip. The light sensor 14 can furthermore have light-sensitive partial surfaces combined into groups, for example, multiple light-sensitive photodiodes. The partial surfaces can be located in the measurement direction, i.e., transversely to an axis extending between the light sensor 14 and the LED light source 2 and can detect multiple bits of a code track 103 or can be located interleaved in succession and can be electrically connected to one another in such a way that sine and cosine signals result, which have a phase shift.

A light-transmissive plate, in particular a glass plate or plastic plate, is arranged above the light sensor 14 as an auxiliary element 17. This auxiliary element 17 can be used, on the one hand, to protect the light sensor 14 and, on the other hand, as a masking attachment. As a masking attachment, the auxiliary element 17 can cover partial areas of the light sensor 14, so that the modulated light is only incident on specific regions of the light sensor 14.

To accommodate the auxiliary element 17, the molded housing 11 has a single recess 19 in the exemplary embodiment of FIGS. 1a and 2a. The auxiliary element 17 accommodated in this recess 19 covers both light sensors 14.

In the exemplary embodiment according to FIG. 1b and FIG. 2b, the mold housing 11 has two recesses 19, in each of which an auxiliary element 17 can be arranged. In this exemplary embodiment, each auxiliary element 17 covers a separate light sensor 14 assigned thereto. The auxiliary element 17 can have the same height as the LED light source 2 and can be in the range of 150 μm to 140 μm. With the auxiliary element 17, a level outside 12 of the optoelectronic component 1 results, although the mold housing itself has one or more recesses 19.

The optoelectronic component 1 can be designed as an SMD component, which can be arranged in a space-saving manner via solder-capable contacts or wire connections on a printed circuit board or similar carrier element. To enable this contacting, the molded housing 11 has connection surfaces 18, which are opposite to the LED light source 2 and the light sensor 14. Via the connection surfaces 18, the signal processing unit 15, by means of which light sensor data can be processed, the LED light source 2 can be regulated, and/or other signal processing processes can be carried out, can be incorporated into a data exchange network, for example, a regulating system for regulating the position of the component equipped with the measuring scale 101.

In addition to the different number of recesses 19 of the molded housing 11, the two exemplary embodiments differ in that in the exemplary embodiment according to FIG. 1b and FIG. 2b, the light sensors 14 are arranged on both sides of the LED light source 2. The LED light source 2 is not located on one side of a light sensor 14, as is the case in the first exemplary embodiment, but rather is arranged, in particular in the middle, between the light sensors 14. The LED light source 2 is arranged for this purpose in a web-shaped part of the molded housing 11 between the two recesses 19. An optical position encoder 100 designed according to this exemplary embodiment is particularly suitable for implementing an absolute encoder indicating the absolute position. A first light sensor 14 can be designed as a master sensor and a second light sensor 14 as a nonius sensor. Alternatively, a first light sensor 14 can detect a pseudorandom track and a second can detect an incremental track having a regular pattern for interpolation and to increase the resolution of the position sensor. In this way, the absolute position of the component can be detected via the measuring scale 101.

Figure 3:
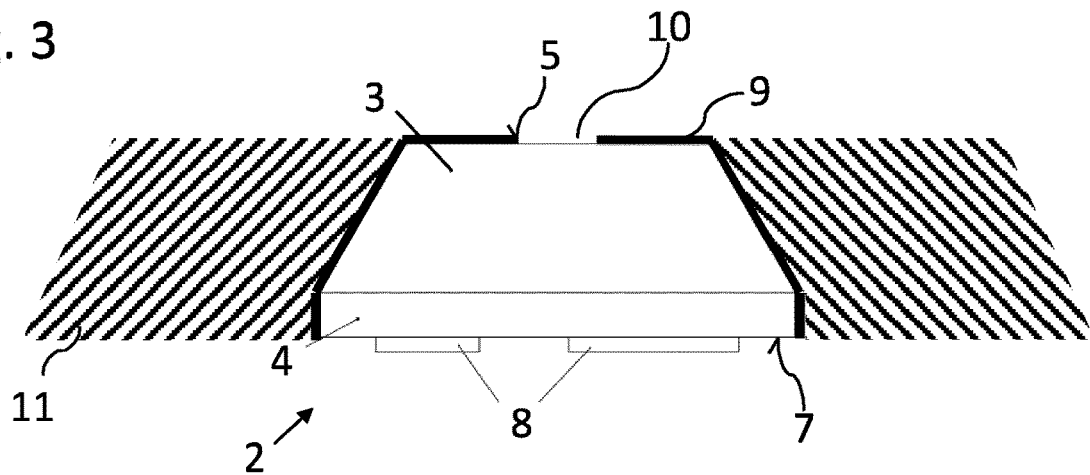
FIG. 3 shows a region of an optoelectronic component in the region of an LED light source.

FIG. 3 shows a region of the optoelectronic component 1 in which the LED light source 2 is arranged in the molded housing 11. Components of the optoelectronic component 1 located counter to the emission direction below the LED light source 2 are not visible, in particular the light sensor 14, the carrier 13, or a lead frame 16, which, depending on the embodiment of the optoelectronic component 1, can be part thereof. The cross-sectional structure of the LED light source 2 is apparent, in which a semiconductor crystal 3 has a trapezoidal cross section and a base region 4.

Diametrically opposite to the light exit surface 5 of the LED light source 2 along the emission direction of the LED light source 2, it has a contact surface 7. The contact surface 7 is used, on the one hand, for electrically contacting the LED light source 2, for which purpose at least two electrodes 8 are arranged on the contact surface 7. An electrical and/or mechanical contact of the LED light source 2 with the other parts of the electrooptical component 1 not shown in FIG. 3 and in particular with the carrier 13 can be established via the contact surface 7 and the electrodes 8. The LED light source 2 is constructed in this way like a flip chip, the electrical contacting of which only takes place from one side via the contact surface 7.

The light exit surface 5, as well as the peripheral partial surfaces 6 of the LED light source 2, have a coating 9. This coating 9 is a chromium-gold alloy applied by means of physical gas phase deposition. Although the coating 9 is shown with a broad line in the figures for better illustration, the coating 9 in reality only has a layer thickness of 400 nm.

The peripheral partial surfaces 6 of the LED light source 2, which are between the light exit surface 5 and the contact surface 7 and can also emit light, are coated over the entire surface using the coating 9. The coating 9 also extends here onto the base region 4 of the semiconductor crystal 3, which also emits light. Alternatively, one or more of the peripheral partial surfaces 6 could also be uncoated or partially coated. In the case of a partial coating, the coating 9 would only extend on individual regions of the peripheral partial surface 6, for example, only on the sections of the peripheral partial surface 6 associated with the base region 6 or the trapezoidal region. The contact surface 7 at least peripherally around the electrodes 8 remains uncoated both with a full-surface and also with a partial-surface coating of one or more of the peripheral partial surfaces 6 using the coating 9. Short-circuits which could otherwise possibly occur between the electrodes 8 are thus prevented.

Peripherally to the LED light source 2, the molded housing 11 directly adjoins the coating 9 of the LED light source 2. Although the molded housing 11 itself is essentially nontransparent in the wavelength range of the LED light source 2, the light-opaque and/or reflective coating 9 prevents an exit of scattered light via the peripheral partial surfaces 6 and the coated region of the light exit surface 5. Since the scattered light cannot exit from the LED light source 2, this can therefore not reach the light sensor 14 and also cannot corrupt the measurements for the position determination.

Due to the reflective properties of the coating 9, the scattered light is reflected back into the interior of the LED light source 2. Due to internal reflections, the light can be reflected here in the interior of the LED light source 2 until it can exit via the de-coated light exit window 10 of the light exit surface 5. The reflected scattered light exits in this way together with the light exiting directly via the light exit window 10, which is not initially reflected inside the LED light source 2, from the LED light source 2, so that the light yield of the LED light source 2, i.e., the photons exiting per unit of area, is increased in comparison to a non-coated LED light source 2.

Although the light exit surface 5 and the peripheral partial surfaces 6 have the same coating 9 in the illustrated exemplary embodiment, it is entirely possible that the peripheral partial surfaces 6 are uncoated or are provided with a different coating 9 than the light exit surface 5. The composition and/or the layer thickness of the coating 9 of one of the peripheral partial surfaces 6 or multiple of the peripheral partial surfaces 6 can thus deviate from the coating 9 of the light exit surface 5. The coating 9 of the light exit surface 5 and/or the coating 9 of one or more of the peripheral partial surfaces 6 can so to speak consist of multiple layers.

In addition to the increase of the light yield and the possibility of providing a smaller light beam to improve the resolution of the entire optical position encoder 100, the de-coated light exit window 10 enables a compensation for manufacturing tolerances of the semiconductor crystal 3 of the LED light source 2 and of tolerances in the positioning of the LED light source 2 in the injection mold before the molding. How this compensation is achieved and a de-coated light exit window 10 is provided is to be explained hereinafter on the basis of the method steps shown in FIGS. 4 to 6.

Figure 4:
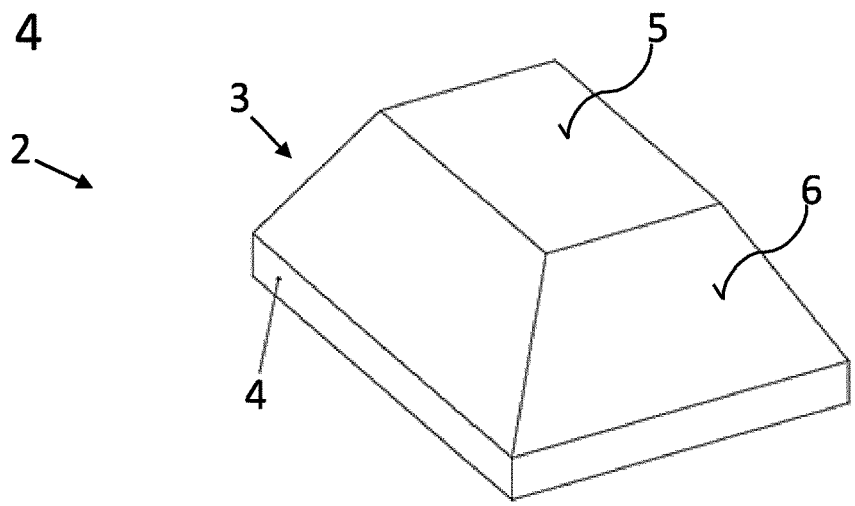
FIG. 4 shows an LED light source in a schematic perspective as a starting point for the method.

In FIG. 4, the initially uncoated LED light source 2 is shown. The semiconductor crystal 3 having its base region 4 can be seen. The contact surface 7 (not shown) has, as the base surface of the LED light source 2, a rectangular shape and in one case measures 240 µm×320 µm. The semiconductor crystal 3, in particular above the base region 4, is in the form of a truncated pyramid and has the light exit surface 5 on the side diametrically opposite to the contact surface 7. In the circumferential direction, the LED light source 2 has the peripheral partial surfaces 6 extending essentially transversely to the light exit surface 5 and the contact surface 7.

The LED light source 2, which is uncoated up to this point, is provided in a first method step with the coating 9. This coating step can take place either before the molding and before or after the installation or fixing of the LED light source on the carrier 13, which is particularly advantageous if at least one of the peripheral partial surfaces 6 is also to be coated. This is because after the molding, the partial surfaces 6 are concealed by the molding compound of the molded housing 11 and in this way can no longer be provided with a coating 9. The coating 9 of the light exit surface 5, in contrast, can also be applied after the molding or, like the coating 9 of the peripheral partial surfaces 6, can take place before the molding and before or after the installation or fixing of the LED light source on the carrier 13. To achieve the most uniform possible coating 9, it is sputtered onto the uncoated light exit surface 5.

Figure 5:
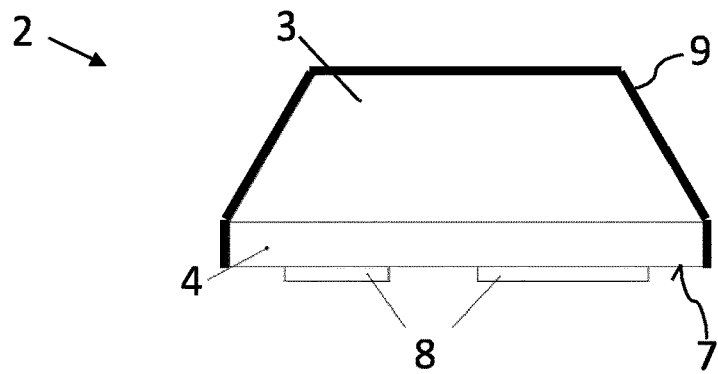
FIG. 5 shows an LED light source having a coated light exit surface in a schematic sectional illustration.

After the sputtering, the light exit surface 5 is coated using the coating 9, as shown in FIG. 5. In the illustrated intermediate step, the light exit surface 5 was covered over the entire surface using the coating 9. To simplify and accelerate the following method step, it is similarly possible that a region of the light exit surface 5, which is later to form a part of the light exit window 10, remains uncoated. For this purpose, a masking element can be introduced into the sputtering beam during the sputtering or a mask can be applied to the light exit surface 5 before the sputtering. In both cases, the masking element or the mask prevents the material of the coating 9 from being deposited in a covered region on the light exit surface 5. The masking element or the mask can be similar in their shape to the light exit window 10 to be achieved, but can have smaller dimensions in comparison thereto.

After the coating of the light exit surface 5, a section of the light exit surface 5 is de-coated to provide the light exit window 10. This de-coating can take place even before the molding. Tolerances in the relative position of the LED light source 2 in relation to the light sensor 14 to the common carrier 13 can be compensated for. To also be able to compensate for tolerances in the positioning of the LED light source 2 in relation to the injection mold and/or the outer sides and edges of the optoelectronic component 1, the de-coating in some regions can take place after the molding, in particular as the last step in the production of the optoelectronic component 1. In this case, both an already coated LED light source 2 can be embedded in the molded housing 11 or the coating 9 can first take place after the molding.

For the de-coating in some regions of the light exit surface 5 and for the provision of the light exit window 10, the coating 9 is removed again from the light exit surface 5 in individual regions. This removal can take place via mechanical processing, chemical etching, or laser bombardment. Especially precise and sharp boundaries of the light exit window 10 may be achieved in particular by means of a laser. The shape and the position of the light exit window 10 can be adapted in the de-coating to the respective requirements of the sensor 14 and thus of the optoelectronic component 1.

Figure 6A:
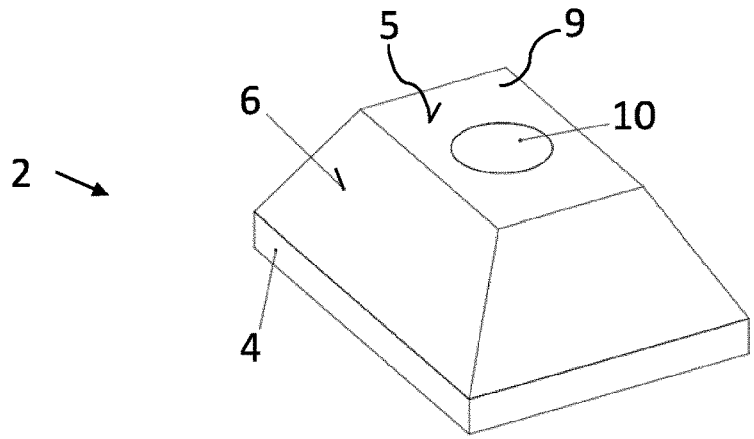
FIG. 6a shows an exemplary embodiment of an LED light source having a coated light exit surface and de-coated exit window.
Figure 6B:
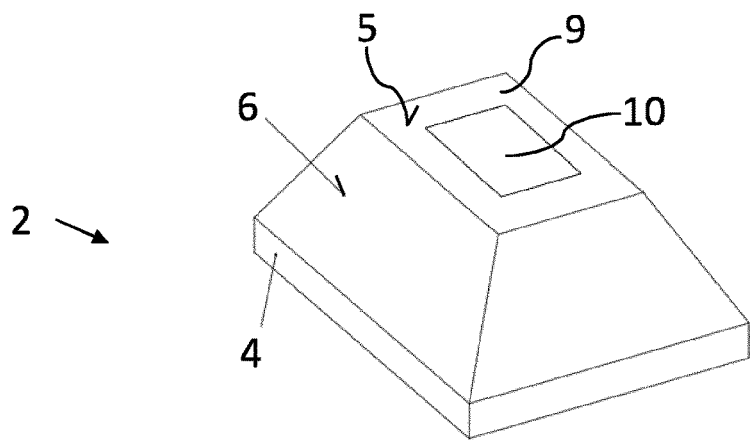
FIG. 6b shows another exemplary embodiment of an LED light source having a coated light exit surface and de-coated exit window.

The circular light exit window shown in FIG. 6a can thus be achieved by circular de-coating. The circular light exit window 10 shown can similarly also be achieved by linear processing, for example, scanning by a laser. Other geometric shapes of the light exit window, for example the rectangular light exit window shown in FIG. 6b or the gap-shaped light exit window shown in FIG. 6c, may also be achieved by the de-coating.

Figure 6C:
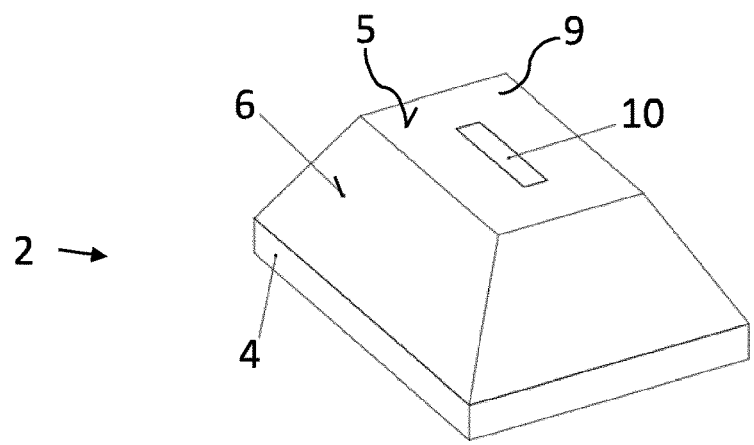
FIG. 6c shows yet another exemplary embodiment of an LED light source having a coated light exit surface and de-coated exit window.

The use of a laser for de-coating may be advantageous in particular to achieve a gap-shaped light exit window 10, as shown in FIG. 6c, since in this way thin gaps having a length of the short gap side of 20 µm may be achieved.

In addition to the simple geometric shapes shown in FIG. 6, further geometric shapes of the light exit window 10 can also be achieved by de-coating the light exit surface 5 in some regions, which may be composed in particular from basic geometric shapes, such as rectangles, gaps, ellipses, and circles.

If a masking element or a mask was used in the coating of the light exit surface 5 so that a region of the light exit surface 5 associated with the light exit window 10 was not coated, the de-coating to provide the light exit window 10 thus takes place in particular in the edge region around this uncoated region, so that a sharp boundary of the light exit window 10 between the coated and the de-coated regions of the light exit surface 5 is achieved by the de-coating method, such as the etching or the lasering.

With the aid of the above-described method and the optical position encoder 100, it is possible to improve the emission properties of the LED light source 2 and to increase the achievable resolution of the optical position encoder 100.

LIST OF REFERENCE NUMERALS

1 optoelectronic component
2 LED light source
3 semiconductor crystal
4 base region
5 light exit surface
6 partial surface
7 contact surface
8 electrodes
9 coating
10 light exit window
11 molded housing
12 outside
13 carrier
14 light sensor
15 signal processing unit
16 lead frame
17 auxiliary element
18 connection surface
19 recess
100 optical position encoder
101 measuring scale
102 region outside the code track
103 region having the code track Having described the invention in detail and by reference to the various embodiments, it should be understood that modifications and variations thereof are possible without departing from the scope of the claims of the present application.

What is claimed is:

1. A method for producing an optical position encoder having an optoelectronic component and having a measuring scale illuminated by an LED light source of the optoelectronic component, in which the LED light source is embedded into a molded housing in such a way that a light exit surface of the LED light source is exposed to the outside, wherein the light exit surface is coated and is de-coated in some regions to provide a light exit window, and wherein at least one peripheral partial surface of the LED light source is coated.

2. The method as claimed in claim 1, wherein the light exit surface is coated over the entire surface or part of the surface using a coating which is at least one of essentially light-opaque or reflective.

3. The method as claimed in claim 1, wherein the light exit surface is coated using a metallic coating made of gold or a gold alloy.

4. The method as claimed in claim 1, wherein the at least one peripheral partial surface of the LED light source and the light exit surface are coated in succession.

5. The method as claimed in claim 1, wherein the light exit surface is coated using a different coating than the at least one peripheral partial surface of the LED light source.

6. The method as claimed in claim 1, wherein the light exit surface is coated by physical gas phase deposition.

7. The method as claimed in claim 1, wherein the light exit surface is de-coated by at least one of etching, mechanical processing, or lasering.

8. The method as claimed in claim 1, wherein the light exit surface is coated before or after the molding.

9. The method as claimed claim 1, wherein the light exit surface is de-coated in some regions before or after the molding.

10. An optical position encoder having an optoelectronic component having a molded housing in which an LED light source is arranged in such a way that a light exit surface of the LED light source is exposed to the outside, and having a measuring scale illuminated by the LED light source of the optoelectronic component, wherein the light exit surface is coated and has a de-coated light exit window, and wherein at least one peripheral partial surface of the LED light source is coated.

11. The optical position encoder as claimed in claim 10, wherein a side of the LED light source facing away from the light exit surface is a contact side of the LED light source.

12. The optical position encoder as claimed in claim 10, wherein at least one light sensor is arranged in the molded housing.

13. The optical position encoder as claimed in claim 12, wherein at least one of the LED light source or the light sensor is arranged on a carrier.

14. The optical position encoder as claimed in claim 12, wherein the LED light source is arranged on a carrier comprising at least one of the light sensor or a signal processing unit.

* * * * *